United States Patent
Stengl et al.

(10) Patent No.: US 7,772,574 B2
(45) Date of Patent: Aug. 10, 2010

(54) PATTERN LOCK SYSTEM FOR PARTICLE-BEAM EXPOSURE APPARATUS

(75) Inventors: Gerhard Stengl, Wernberg (AT); Herbert Buschbeck, Vienna (AT); Robert Nowak, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 508 days.

(21) Appl. No.: 11/719,320

(22) PCT Filed: Nov. 15, 2005

(86) PCT No.: PCT/AT2005/000454
§ 371 (c)(1),
(2), (4) Date: May 15, 2007

(87) PCT Pub. No.: WO2006/053358
PCT Pub. Date: May 26, 2006

(65) Prior Publication Data
US 2009/0146082 A1  Jun. 11, 2009

(30) Foreign Application Priority Data
Nov. 17, 2004  (AT) .............................. A 1927/2004

(51) Int. Cl.
*G21K 5/10* (2006.01)
(52) U.S. Cl. ................. 250/492.22; 250/492.1
(58) Field of Classification Search ... 250/492.1–492.3, 250/491.1, 396 R–396 ML
See application file for complete search history.

(56) References Cited

U.S. PATENT DOCUMENTS

| 4,823,011 A | 4/1989 | Stengl et al. |
| 4,967,088 A | 10/1990 | Stengl et al. |
| 4,985,634 A * | 1/1991 | Stengl et al. ............. 250/492.2 |
| 5,576,833 A * | 11/1996 | Miyoshi et al. ............. 356/394 |
| 6,768,125 B2 * | 7/2004 | Platzgummer et al. . 250/492.22 |
| 7,135,677 B2 * | 11/2006 | Kienzle et al. ............. 250/310 |
| 7,138,629 B2 * | 11/2006 | Noji et al. ................... 250/311 |
| 7,214,951 B2 * | 5/2007 | Stengl et al. ........... 250/492.23 |
| 7,276,714 B2 * | 10/2007 | Platzgummer et al. . 250/492.22 |
| 7,368,738 B2 * | 5/2008 | Platzgummer ......... 250/492.23 |
| 2003/0155534 A1 * | 8/2003 | Platzgummer et al. . 250/492.22 |
| 2004/0084621 A1 * | 5/2004 | Kienzle et al. ............. 250/310 |
| 2005/0104013 A1 * | 5/2005 | Stengl et al. ........... 250/492.21 |
| 2005/0242302 A1 * | 11/2005 | Platzgummer et al. . 250/492.22 |
| 2005/0242303 A1 * | 11/2005 | Platzgummer ......... 250/492.22 |

OTHER PUBLICATIONS

International Search Report for PCT/AT2005/000454 on Apr. 6, 2006.

* cited by examiner

*Primary Examiner*—Bernard E Souw
*Assistant Examiner*—Andrew Smyth
(74) *Attorney, Agent, or Firm*—RatnerPrestia

(57) ABSTRACT

In a pattern-lock system of particle-beam apparatus wherein the imaging of the pattern is done by means of at least two consecutive projector stages of the projecting system, reference marks are imaged upon registering means to determine the position of the particle-beam, at the location of an intermediary image of the reference marks produced by a non-final projector stage, with the registering means being positioned at locations of nominal positions of an intermediary imaging plane. Furthermore, to produce a scanning movement over the registering means the reference beamlets are shifted laterally by means of deflector means provided in the pattern defining means in dependence of a time-dependent electric voltage.

8 Claims, 10 Drawing Sheets

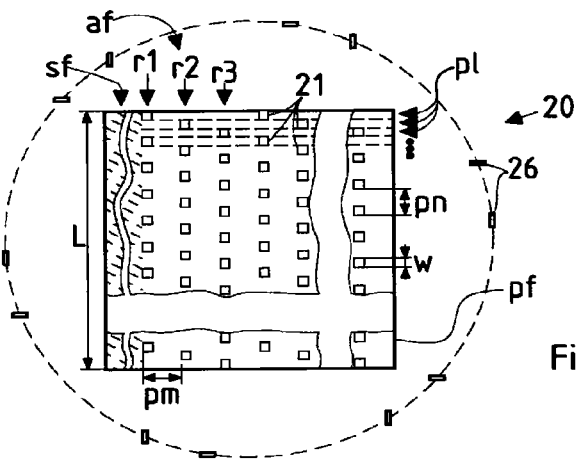
Fig. 2
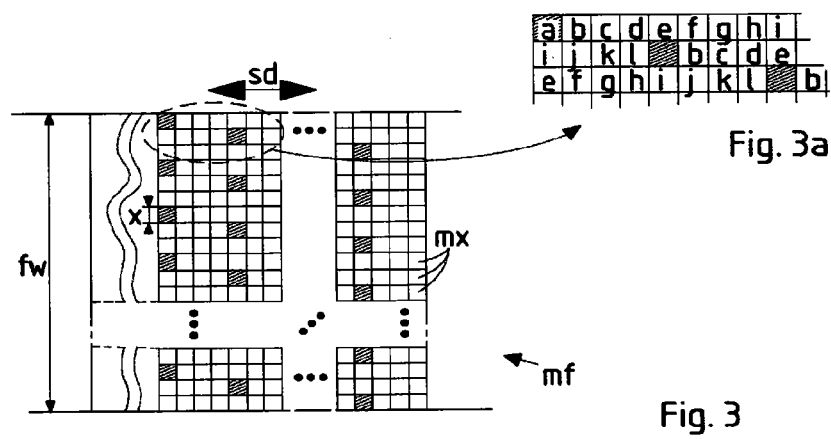
Fig. 3a
Fig. 3
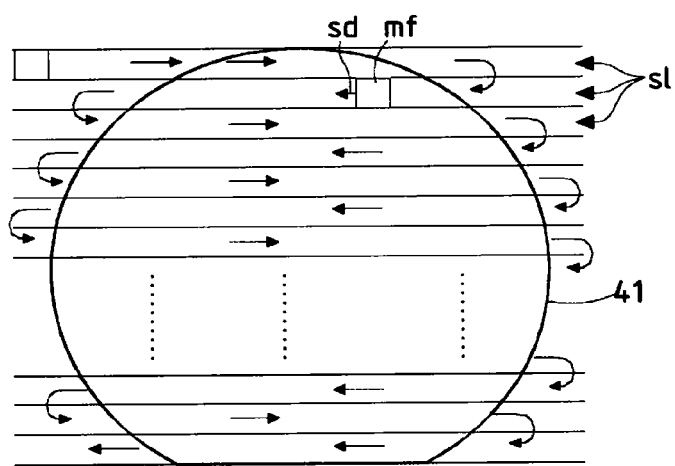
Fig. 4

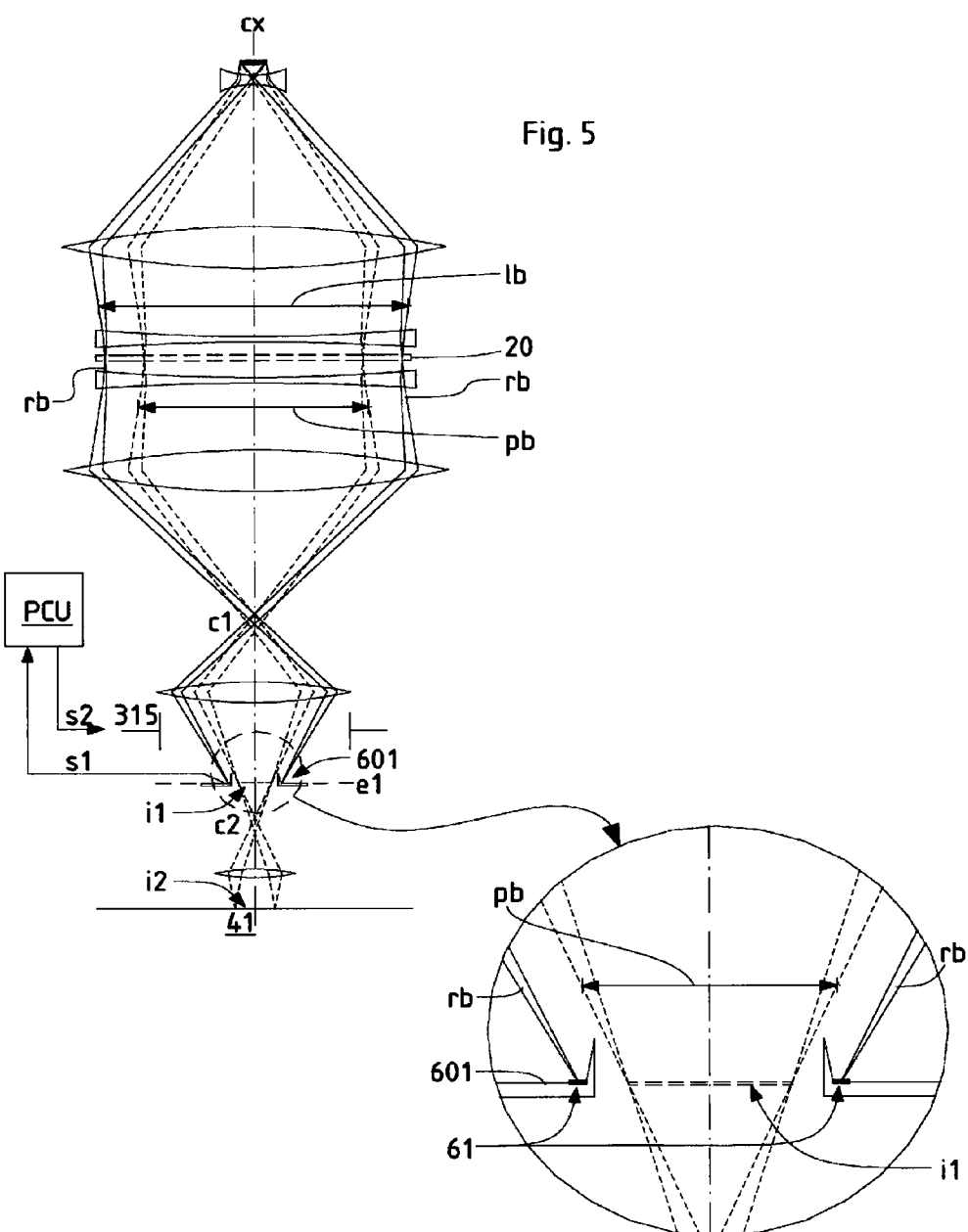

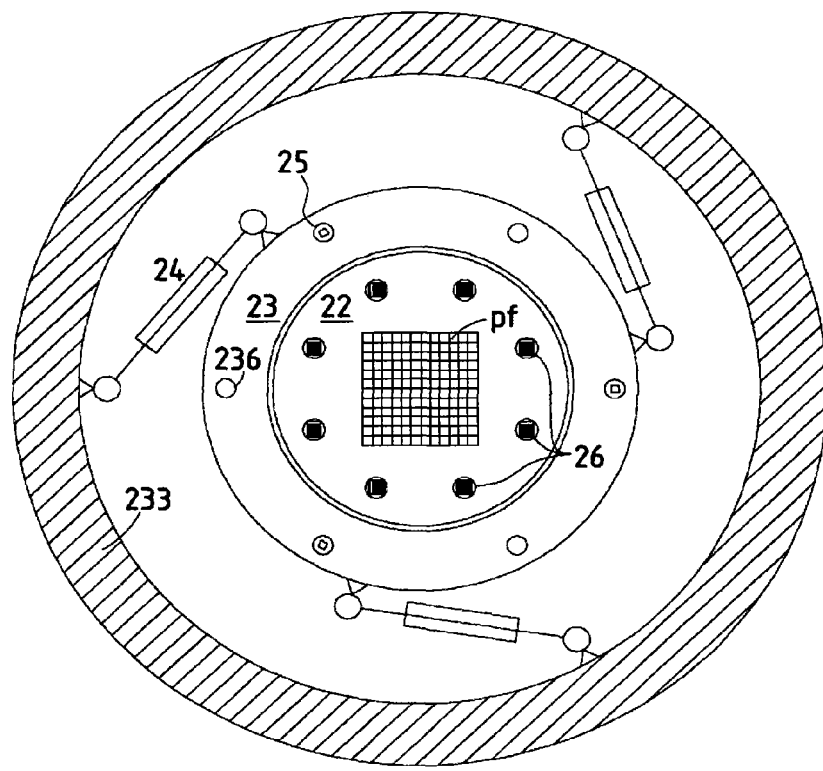
Fig. 6a
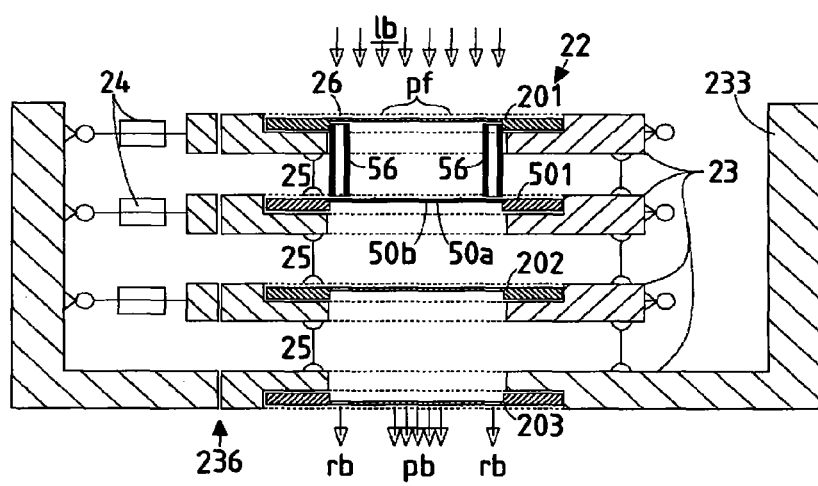
Fig. 6b
Fig. 6

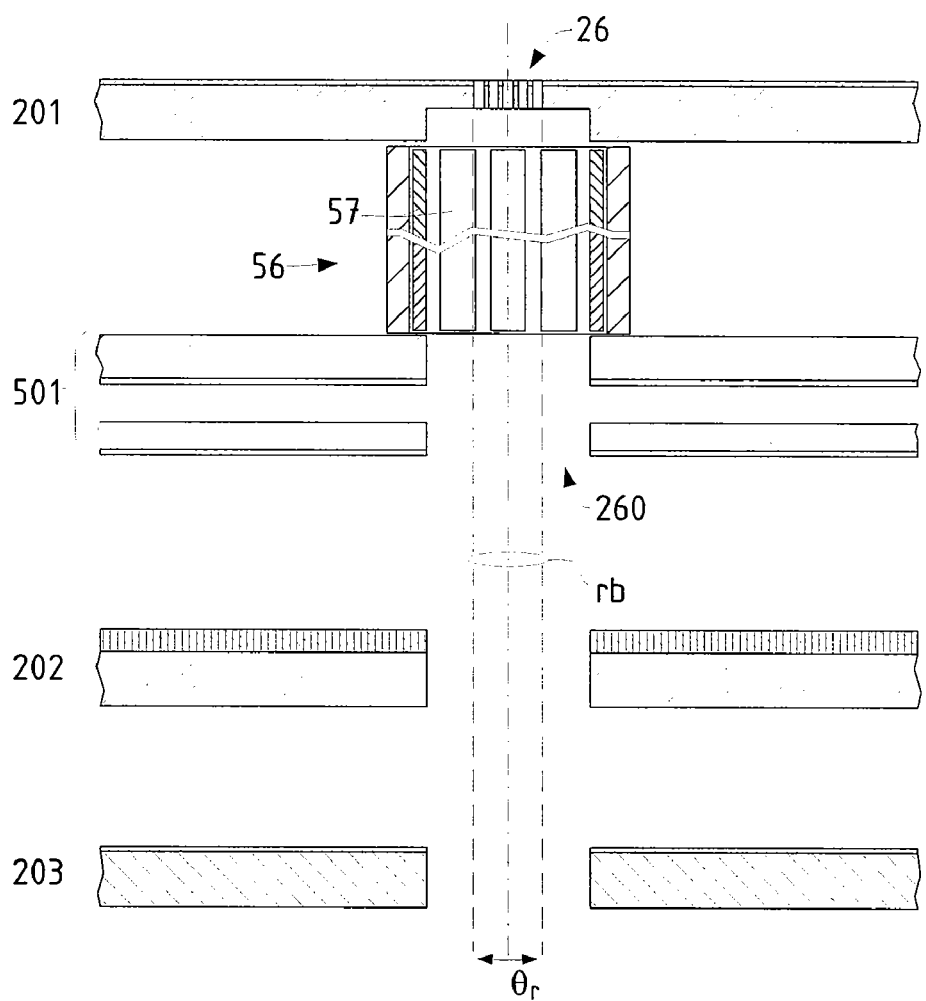
Fig. 8
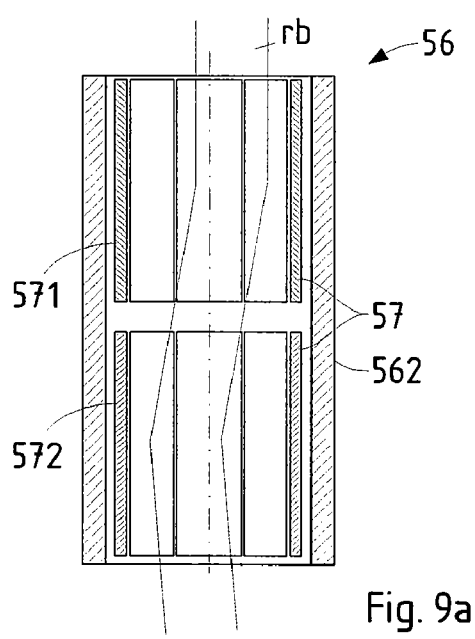
Fig. 9a
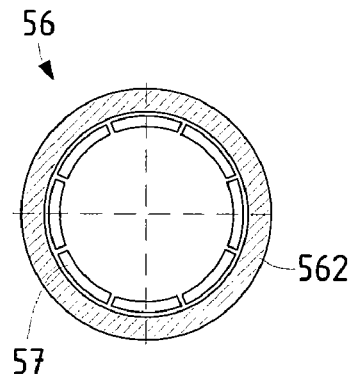
Fig. 9b
Fig. 9

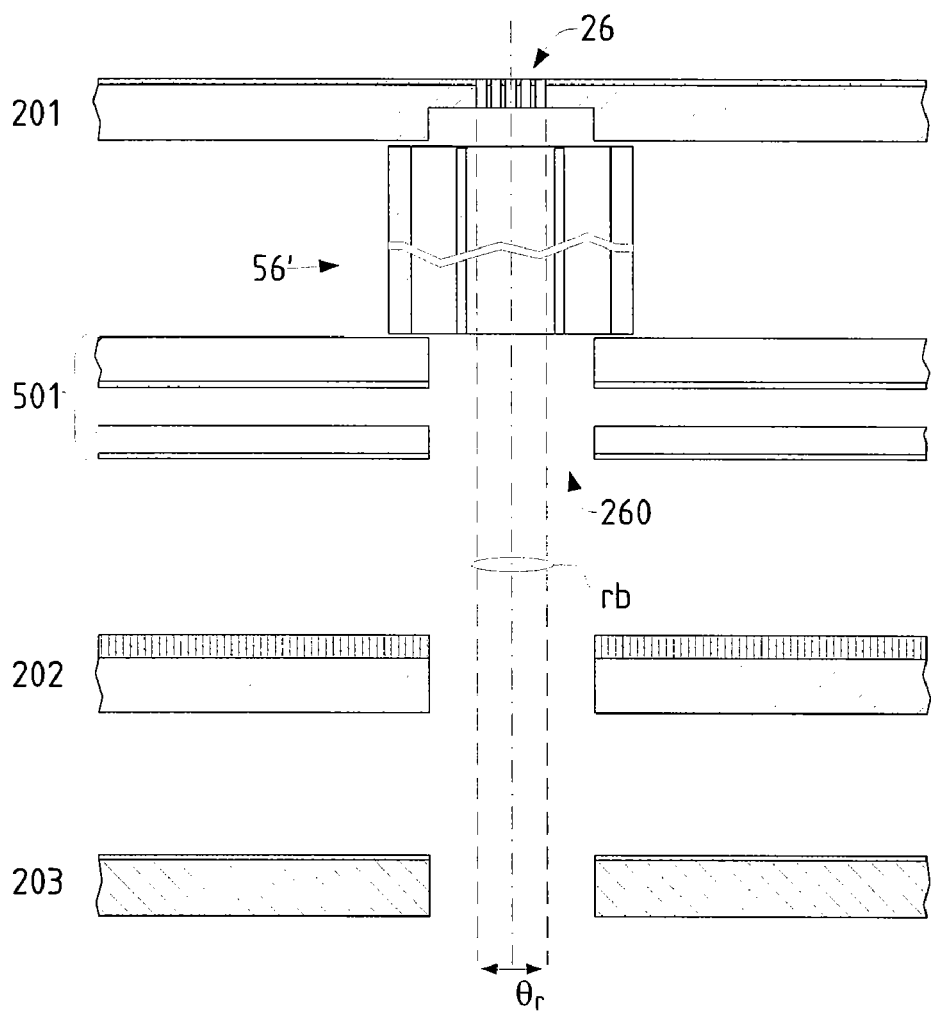
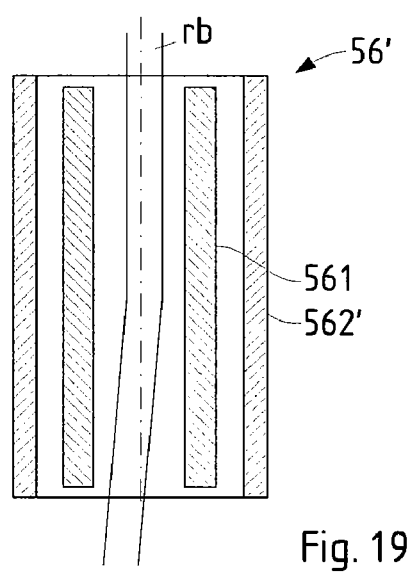
Fig. 19a
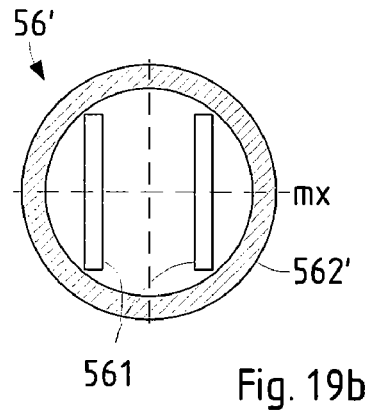
Fig. 19b
Fig. 19

PATTERN LOCK SYSTEM FOR PARTICLE-BEAM EXPOSURE APPARATUS

CROSS-REFERENCE TO RELATED APPLICATIONS

This application is a U.S. National Stage Application of PCT Application No. PCT/AT2005/000454, filed Nov. 15, 2005, which claims priority from Austrian Patent Application No. A 1927/2004, filed on Nov. 17, 2004.

FIELD OF THE INVENTION AND DESCRIPTION OF PRIOR ART

The invention relates to improvements of pattern-lock methods for use in a particle-beam processing apparatus. More in detail, the invention relates to a method of controlling the positioning of an image of a pattern in a particle-beam projection processing apparatus during exposure of a target with the image; the pattern is formed in a pattern defining means and is, by means of a beam of electrically charged particles, imaged through a particle-optical projecting system onto the target, in the following conceptual steps:
  imaging a number of reference marks provided in the pattern defining means through the same projecting system onto a corresponding number of registering means positioned at locations of desired positions of images of the reference marks,
  detecting images of the reference marks at the registering means generating corresponding signals in dependence of the fine position of the respective images,
  processing these signals in a control means and deriving control signals for adjusting the imaging properties of the projecting system and bringing the reference mark images into coincidence with the mentioned desired positions.

Methods and devices for so-called pattern-locking, i.e. holding fixed the position of the imaged structure pattern on a target, such as a wafer substrate, in a particle projection system are well-known and are discussed in detail in U.S. Pat. No. 4,823,011 (=EP 0 250 391) and U.S. Pat. No. 4,967,088 (=EP 0 294 363) of the applicant (assignee).

One important application of processing apparatus of this kind is in the field of particle-beam lithography used in semiconductor technology, as a lithography apparatus, wherein, in order to define a desired pattern on a substrate surface, the wafer is covered with a layer of a radiation-sensitive photoresist, a desired structure is imaged onto the photoresist by means of a lithography apparatus which is then patterned by partial removal according to the pattern defined by the previous exposure step and then used as a mask for further structuring processes such as etching. Another important application of processing apparatus of this kind is in the field of nano-scale patterning, by direct ion beam material modification or ion beam induced etching and/or deposition, used for the fabrication or functionalization of nano-scale devices, particularly having sub-100 nm feature sizes.

In the process of forming a desired pattern on a wafer (or like target) it is a regular requirement to keep the position of the image accurately on the wafer during exposure; this task is commonly referred to as pattern-locking. Pattern-locking is done, e.g., with respect to the X and Y translation of the image in the wafer plane, rotation angle $\theta$ and magnification $M_X$ and $M_Y$ with respect to the lateral scales, respectively, as well as trapezoid distortion $\Delta_X$ and $\Delta_Y$. During exposure, variations of these parameters may occur by voltage fluctuations (magnification M) or by slight movements of the target station with respect to the projection system, both in lateral directions X,Y and in Z direction, the latter causing also change in magnification M; another major source of imaging variations are external magnetic and/or electromagnetic fields.

Since the position of the pattern image in the patterned beam cannot be measured directly (that would interfere with the image), additional reference beams, so-called 'reference beamlets', are employed for the purpose of alignment. The beamlets are defined in the device patterning the beam (mask or other pattern definition device), namely, by reference apertures positioned next to but separate from the pattern field, and are imaged towards the target plane in the same way as the beam portion which bears the pattern information of the image to be formed on the target. Thus, the beamlets surround a central beam portion which bears the pattern information and is also referred to as 'dye beam'. In contrast to the dye beam, the reference beamlets do not reach the target (unlike the dye beam, they shall not be imaged onto the target), but they are registered in a corresponding number of detection units which serve as registering means measuring the positions of the individual beamlets, and the positions thus measured are compared with nominal positions relative to a stable reference plane in order to derive correction signals for the optical system.

The detection units are contained in a reference apparatus, which is positioned in front of the target as seen in the direction of the beam (i.e., upstream). The reference apparatus together with the system to derive the correction signals from the measuring signals of the reference apparatus are referred to as pattern-lock system. (Sometimes in this term also those optical elements of the imaging system which are controlled by said correction signals are included.)

In usual state-of-the-art setups, the reference apparatus comprises a scanner block and a reference plate, wherein the scanner block is positioned in front of the reference plate. The reference plate is provided with registration marks for detecting incident beamlets in cooperation with detectors housed in the scanner block, which also comprises deflector means for the beamlets. Each beamlet is associated with a respective deflector means through which it passes, a registration mark and a detector. Upon incidence with a registration mark, the beamlet produces secondary electrons which are detected by the respective detector. By means of the deflector means, each beamlet is scanned across the registration mark; the frequency of the scanning movement is typically in the 100 Hz range. From the time-dependent detector signal, taking into account the time-dependent deflection voltage signal, the position of the beamlet (that is, with respect to its non-deflected position) is derived.

A state-of-the-art scanner block is a device surrounding an opening for the dye beam, for instance as a ring-shaped unit with a circular opening in order to affect the electrical fields guiding the beam as little as possible. On the other hand, the reference beamlets are situated outside of the pattern beam region, in order to pass through the detector means situated in the scanner block. The geometry of the reference beamlets is reflected in the layout of the pattern definition device, in which the reference marks are situated in a (usually ring-shaped) area surrounding the pattern field of the aperture pattern. The beam illuminates the pattern field as well as the reference marks, consequently it must be sufficiently defined (with respect to homogeneity and optical aberrations) over the total area including the reference mark area.

This layout of the reference device brings about space problems, in particular in reducing optics since the image produced at the target is small and the final optical elements do not allow sufficient room for space-consuming devices such as a scanner block. Therefore, new ways are sought to resolve the space problems inferred from a pattern-lock device. This task is solved by means of the invention through several aspects.

SUMMARY OF THE INVENTION

A first aspect of the invention is applicable in a particle-beam apparatus wherein the imaging of the pattern is done by means of at least two consecutive projector stages of the projecting system, namely, at least one non-final projector stage and one final projector stage, the latter producing the image of the pattern. In contrast to the pattern image, the detection of reference marks images is done at the location of an intermediary image of a non-final projector stage, the registering means being positioned at locations of nominal positions of an intermediary imaging plane. This solution allows to perform the pattern-lock at a place with considerably alleviated space restrictions; moreover, with reducing imaging systems, the intermediate image is at a lower degree of demagnification, so the detection devices can be formed with relieved miniaturiziation.

According to a second aspect of the invention, the scanning movement of the reference beamlets is generated already at the place of the pattern definition device. Thus, reference beamlets formed by at least one of the reference marks are shifted laterally by means of deflector means provided in the pattern defining means in dependence of a time-dependent electric voltage applied to the deflector means, resulting in a corresponding time-dependent scanning movement of the respective reference mark image(s). In one preferred embodiment, the lateral shift of the reference beamlets may be generated by two (or more) sets of electrodes, which are positioned in series as seen along the direction of the beamlets, for instance electrode multipoles.

Another aspect of the invention uses the exposure pauses between two exposure steps, such as the pausing for movement of the beam to another die field on a wafer. During exposure pauses a lateral movement of the reference mark images is applied by means of the projecting system—in particular, by means of a deflection means such as an electrostatic multipole means—and the resulting varying signals from the image detection are recorded, and based on these signal data a suitable operation point for the position of the reference mark image with regard to the respective registering means is selected. This procedure allows repeated recalibration of the reference system, improving the qualtiy of the pattern-lock control loop.

In order to obtain an improved resolution of the relative position of a reference beam, a reference mark image may be detected by means of a registering means comprising a multitude of detective areas arranged beside each other and detection signals produced by the detective areas when hit by radiation from the reference mark are added to a sum signal, wherein the detective areas yield different contributions to the detection signal in relation to a unit of impingent radiation, respectively, resulting in a sum signal varying in dependence of the position of the reference mark image with respect to the detection means. In one suitable relaization of such a detection means, the detective areas are alternatively connected to the positive and negative input of a subtracting unit. Alternatively, the detective areas may be realized as portions which are alternatively elevated and lowered with regard to the direction of the radiation by a height difference which should be not smaller than the lateral width of the portions.

BRIEF DESCRIPTION OF THE DRAWINGS

In the following, the present invention is described in more detail with reference to the drawings:

FIG. 2 shows a plan view of the aperture arrangement in a pattern definition device of the lithography apparatus of FIG. 1;

FIG. 3 shows an image field as present on a substrate surface;

FIG. 4 illustrates the motion of the image field of FIG. 3 on a wafer substrate to be exposed;

FIG. 5 shows an overview of a particle-beam apparatus and its pattern-lock system according to a preferred embodiment, and FIG. 5a shows a detail of the reference beam registering;

FIGS. 6a and 6b show the pattern definition device in a top view (FIG. 6a) and a longitudinal section (FIG. 6b);

FIG. 8 shows another detail of FIG. 6b showing the details of a reference mark;

FIGS. 9a and 9b show a longitudinal section detail (FIG. 9a) and a cross-section detail (FIG. 9b), respectively, of the deflecting unit in the reference mark of FIG. 8.

FIGS. 18, 19a and 19b show a simplified variant of a reference mark in three views corresponding to those of FIGS. 8, 9a and 9b.

DETAILED DESCRIPTION OF THE INVENTION

Figure 1:
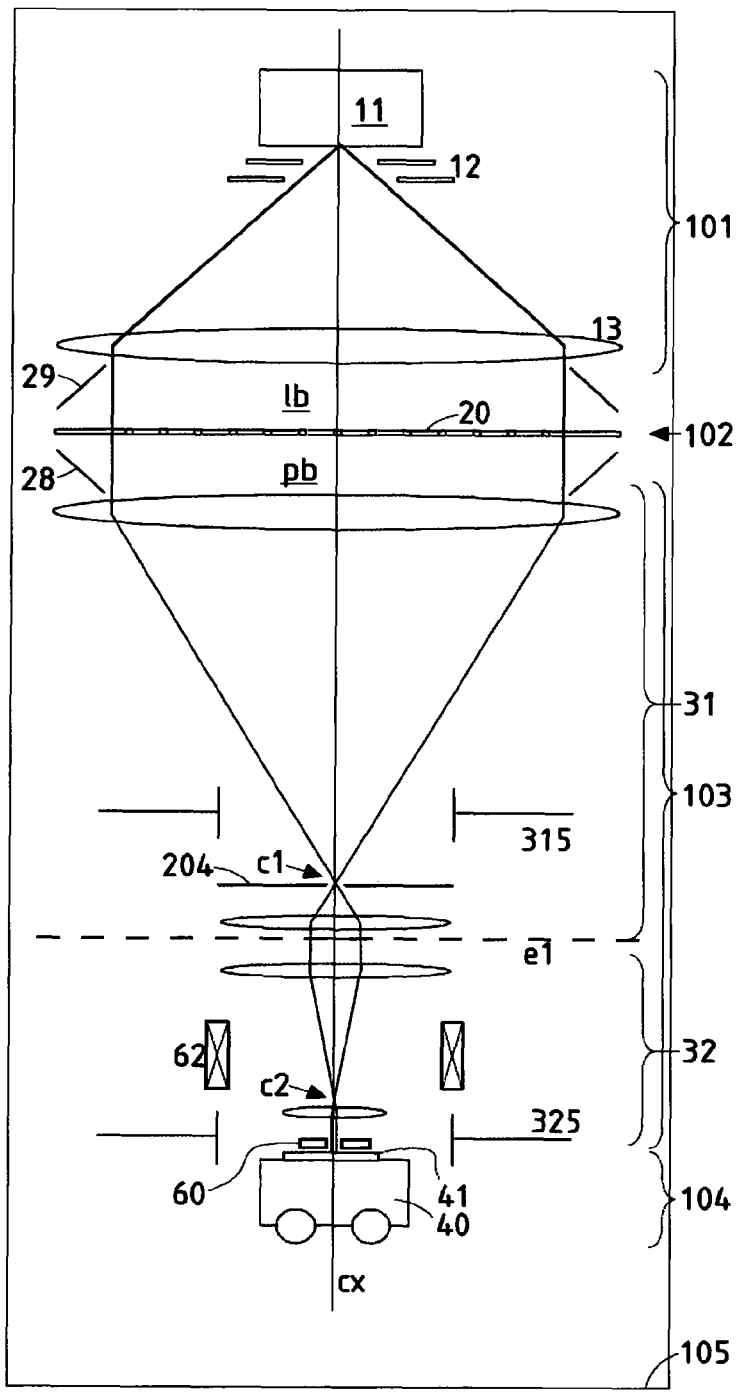
FIG. 1 shows, in a longitudinal section, a layout of a maskless particle-beam apparatus of the state of the art.

For the explanations in this disclosure, a Cartesian coordinate system is used with Z denoting the axial coordinate along the optical axis and X, Y denoting the two perpendicular directions.

The preferred embodiment of the invention discussed in the following is based on the pattern definition (PD) system disclosed in the U.S. Pat. No. 6,768,125 (=GB 2 389 454 A) of the applicant (assignee) whose teaching is herewith incorporated into this disclosure. In the following, the technical background of the PD system, as far as relevant to the invention, is first discussed with reference to FIGS. 1 to 4 (which correspond to those of the U.S. Pat. No. 6,768,125), then embodiments of the invention in the PD system are discussed. It should be appreciated that the invention is not restricted to the following embodiments nor the PD system, which merely represent one of the possible implementations of the invention; rather, the invention is suitable for other types of particle-beam exposure systems as well.

Pattern Definition Device and PML2 System

The PD system as described in the U.S. Pat. No. 6,768,125 realizes a multi-beam direct write concept, dubbed PML2 (short for "Projection Mask-Less Lithography #2"). It employs a PD device comprising a number of plates stacked on top of the other, among them an aperture array means (aperture plate) and a blanking means (blanking plate). These separate plates are mounted together at defined distances, for instance in a casing. The aperture array means has a plurality of apertures of identical shape defining the shape of beamlets permeating said apertures, wherein the apertures are arranged within a PD field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings. The teaching of the U.S. Pat. No. 6,768,125 with regard to the architecture and operation of the PD device, and in particular the architecture of its blanking plate, are hereby included as part of this disclosure.

As already mentioned, an electron beam generated by an illumination system is used in the PML2 system. It illuminates the PD means in order to define a beam pattern to be projected on a target surface. The passage of each beam through an aperture can be controlled so as to allow ('switch on') or effectively deactivate ('switch off') the passage of particles of the beam through the respective apertures. The beam permeating the aperture array (or more exactly, through the switched-on apertures of the array) forms a patterned particle beam bearing a pattern information as represented by the spatial arrangement of the apertures. The patterned beam is then projected by means of a particle-optical projection system onto the target (for instance, a semiconductor substrate) where an image of the apertures is thus formed to modify the target at the irradiated portions. The image formed by the beam is moved continuously along a straight path over each die field; additional scanning of the beam in a direction perpendicular to the scanning direction is not necessary (except, where needed, to compensate for lateral travel motion errors of the scanning stage).

An overview of a maskless particle-beam exposure apparatus PML2 employing the preferred embodiment of the invention is shown in FIG. 1. In the following, only those details are given as needed to disclose the invention; for the sake of clarity, the components are not shown to size in FIG. 1. The main components of the apparatus 100 are—corresponding to the direction of the lithography beam lb, pb which in this example runs vertically downward in FIG. 1—an illumination system 101, a PD system 102, a projecting system 103, and a target station 104 with the substrate 41. The whole apparatus 100 is contained in a vacuum housing 105 held at high vacuum to ensure an unimpeded propagation of the beam lb, pb along the optical axis cx of the apparatus. The particle-optical systems 101, 103 are realized using electrostatic or electromagnetic lenses.

The illumination system comprises, for instance, an electron gun 11, an extraction system 12 as well as a condenser lens system 13. It should, however, be noted that in place of electrons, in general, other electrically charged particles can be used as well. Apart from electrons (emitted from an electron gun) these can be, for instance, hydrogen ions or heavy ions; in the context of this disclosure heavy ions refer to ions of elements heavier than C, such as O, N, or the noble gases Ne, Ar, Kr, Xe.

The ion source 11 emits energetic ions, i.e., having a defined (kinetic) energy of typically several keV, e.g. 10 keV. By means of an electro-optical condenser lens system 13, the ions emitted from the source 11 are formed into a wide, substantially telecentric ion beam serving as lithography beam lb. The lithography beam lb then irradiates a PD device 20 which, together with the devices needed to keep its position, form the PD system 102. The PD device 20 is held at a specific position in the path of the lithography beam lb, which thus irradiates a plurality of apertures 21 (see FIG. 2). Some of the apertures are "switched on" or "open" so as to be transparent to the incident beam; the other apertures are "switched off" or "closed", i.e. non-transparent (opaque) to the beam. The pattern of switched-on apertures is chosen according to the pattern to be exposed on the substrate, as these apertures are the only portions of the PD device transparent to the beam lb, which is thus formed into a patterned beam pb emerging from the apertures (in FIG. 1, below the device 20).

The pattern as represented by the patterned beam pb is then projected by means of an electro-optical projection system 103 onto the substrate 41 where it forms an image of the switched-on mask apertures 21. This is in contrast to, e.g., Arai et al., where rather than the apertures, images of the particle source are formed on the substrate. The projection system 103 implements a demagnification of, for instance, 200× with two crossovers c1,c2. The substrate 41 is, for instance, a silicon wafer covered with a photo-resist layer. The wafer 41 is held and positioned by a wafer stage 40 of the target station 104.

In the embodiment of the invention shown in FIG. 1, the projection system 103 is composed of two consecutive electro-optical projector stages 31,32. The electrostatic lenses used to realize the projectors 31,32 are shown in FIG. 1 in symbolic form only as technical realizations of electrostatic imaging systems are well known in the prior art, such as, for instance, the U.S. Pat. No. 4,985,634 (=EP 0 344 646) of the applicant. The first projector stage 31 images the plane of the apertures of the device 20 into an intermediate plane e1 which in turn is imaged onto the substrate surface by means of the second projector stage 32. In the intermediate plane e1 the beam is substantially telecentric as it is at the position of the PD device. Both stages 31,32 employ a demagnifying imaging through crossovers c1,c2; thus, while the intermediate image in the plane e1 is inverted, the final image produced on the substrate is upright (non-inverted). The demagnification factor is about 14× for both stages, resulting in an overall demagnification of 200×. A demagnification of this order is in particular suitable with a lithography setup, in order to elevate problems of miniaturization in the PD device.

After the first stage 31 the beam width is well reduced—for instance, from an initial width of the PD field pf (FIG. 2) of L=60 mm to about 4 mm at the intermediate plane e1. As a consequence, since the dimensions of the electro-optical components of the second stage 32 need not be reduced to the same scale as the beam width, the lens elements can be realized larger with respect to the beam, which allows for an easier treatment of lens defects and imaging aberrations. For example, with a total source-substrate length of about 2 m, the focal length of the final lens after the second stage crossover c2 can be as small as about 20 mm. This allows for high ion currents that can be treated, for instance of the order of 4 to 10 µA, because space charge correlation have only little influence.

In both projector stages the respective lens system is well compensated with respect to chromatic and geometric aberrations; furthermore, a residual chromatic aberration of the first stage 31 can be compensated by suitable fine correction of the electrode potentials in the second stage 32. By virtue of the chromatic compensation, the energy of the ions (or in general, charged particles) emitted from the source 11 are allowed to have a comparatively high energy blur of up to $\Delta E=6$ eV. This allows to use sources with less stringent requirements for quality and, therefore, emitting higher currents.

Furthermore, the effect of stochastic errors, which are due to particle interactions mainly in the crossovers $c1,c2$, is reduced as the stochastic errors of the first stage are demagnified in the second stage, and stochastic errors in the second stage have little influence due to the small distance of the second crossover $c2$ from the substrate plane.

As a means to shift the image laterally, i.e. along a direction perpendicular to the optical axis cx, deflection means 315,325 are provided in one or both of the projector stages. The deflection means can be realized as, for instance, a multipole electrode system which is either positioned near to the crossover, as shown in FIG. 1 with the first stage deflection means 315, or after the final lens of the respective projector, as is the case with the second stage deflection means 325 in FIG. 1. In this apparatus, a multipole electrode is used as deflection means both for shifting the image in relation to the stage motion and for correction of the imaging system in conjunction with the pattern-lock system explained in detail below; additionally, a magnetic coil 62 may be used to generate a rotation of the pattern in the substrate plane where needed.

FIG. 2 shows a plan view of the arrangement of apertures in the PD device 20. A plurality of square-shaped apertures 21 is provided which are arranged within a PD field pf in a regular array in which the apertures 21 are aligned along adjacent lines pl, wherein in each of the lines pl the same number of apertures is present. The PD field pf may be segmented into stripes containing apertures, referred to as apertures fields af, and regions sf clear of apertures. In the aperture fields af, seen along the direction perpendicular to the lines pI, the apertures form a sequence of rows $r1,r2,r3$; in the embodiment shown, the rows $r1$-$r3$ are not adjacent but spaced apart. The apertures are arranged in the aperture fields af according to a skewed regular arrangement: The apertures of every third row align ($n=3$; in other embodiments, n may also assume other values $>2$) as the pitch pn between neighboring rows is three times the width w of an aperture (i.e., $pn=n \times w$), and the offset pm between neighboring rows is 4 times the width of an aperture (i.e., $pm=m \times w$ with $m=4$; m may also assume other values $>2$). Within a line pl, the offset of apertures is $n \cdot pm=12$. Thus, the apertures cover only $1/(n \times m)=\frac{1}{12}$ of the area of the field af and, at a time, only one out of $n \times m=12$ image elements can be exposed as shown in FIG. 3; the other elements are exposed in subsequent steps by means of moving the substrate along the "scanning direction" sd relative to the image of the apertures. For the spatial arrangement of the apertures 21 and the layout of circuitry to control the apertures it is referred to U.S. Pat. No. 6,768,125.

FIG. 3 illustrates the image field mf produced on the substrate; for the sake of clarity it is assumed that all apertures are switched on in this figure. The width fw of the image field is the width L of the PD field pf reduced by the demagnification factor of the projection system.

The image field is composed of a plurality of image elements mx (also referred to as pixels). For a given position of the image field on the substrate, each of the apertures 21 of the aperture array corresponds to an image element mx, but as the apertures only cover a fraction of the PD field area, only a corresponding fraction of the number of image elements (shown hatched in FIG. 3) can be exposed at a time. In order to expose also the other image elements, the substrate is moved under the beam so as to shift the image field on the substrate. FIG. 3a illustrates the exposure of pixels in subsequent positions of the motion of the substrate through the possible 12 ($=n \times m$) positions; the pixels are accordingly referenced with letters a to 1 (the pixels shown hatched are position a). The whole image field mf is moved over the surface of the photoresist-covered wafer serving as substrate 41 so as to cover the total area of the substrate surface. As shown in FIG. 4, in order to minimize the path length of the movement, the scanning direction sd alternates from one scan line sI to the next (boustrophedonal motion).

In the example discussed here, the minimum feature is 50 nm, for instance, and the smallest spot to be illuminated on the wafer, here defined as the pixel width x, is 25 nm. The image field width fw is 300 μm; in order to produce this image field in connection with a two-stage 200× demagnification projection system as mentioned, the square-shaped PD field has a width $L=60$ mm. It should be noted that the parameters n, m, w etc. used in the example illustrated in FIGS. 2 to 4 can also take other respective values instead of those described above.

Beam Control

The task of controlling the position of the dye beam on the target can be split into the several tasks which are attributed to different control systems according to the respective speed of control:

1. Wafer Alignment. Any target to be processed, in particular wafers containing structures from previous processing steps, have to be properly aligned with respect to the lithography beam to ensure proper image overlay. This procedure has to be done once for every wafer to be processed. For wafer alignment, methods are well-known from prior art and are not further discussed here.

2. Footprint calibration. The associated rate is well below 0.1 Hz, typically about 0.01 Hz. In order to compensate for long-term drifts of the system, the complete optical column is recalibrated at predetermined intervals. For this, the position of the lithography beam with respect to the stage system 40 and the beam footprint is measured. For footprint calibration, methods are well-known from prior art and not further discussed here.

3. Pattern-Lock. This takes place at a rate of the order of 1 kHz to be able to compensate for disturbances in the order of 100 Hz. The beam position is measured by means of a registering device at real-time and locked at the position of the registering device through a closed control loop. Pattern-locking serves to compensate short-term drifts in the particle-beam system and is discussed in detail below.

4. Beam Tracking. This happens at a rate of the order of 1 kHz. Deviations of the stage system 40 with regard to a nominal position are corrected by a beam tracking system. Beam tracking systems are well-known from prior art and are close related to write-on-the-fly techniques.

5. Toggle Correction. The pattern to be imaged onto the target is moved through the lines of apertures by a rate of typically 1 MHz or more. This discrete movement is adapted to the continuous movement of the target stage 40. This is suitably achieved by means of the reflections means 325 which supply a correcting shift (saw-tooth-like over time) to the image on the target.

This disclosure focuses on the pattern-lock system for particle-beam apparatus such as the PML2 system. The pattern lock is required to compensate electromagnetic, in particular magnetic, disturbances in the regime around 100 Hz.

Pattern Lock System

A pattern-lock system is provided in order to stabilize the position of the image of the mask apertures (image field mf) on the substrate with respect to the ion-optical system. The principles of a pattern-lock system are described in U.S. Pat. No. 4,823,011 and U.S. Pat. No. 4,967,088. The entire contents of these two patent documents are hereby incorporated through reference.

According to the pattern-lock concept, a number of reference beams rb are used which are formed in the PD system by reference marks 26 at the side of the PD field pf (FIG. 6). The reference beamlets propagate through the optical column together with the dye beam, thus experiencing substantially the same treatment (by the optical elements) and disturbances (by other sources) as the dye beam. A typical layout of the reference marks 26 is, for instance, a number of slots in a field of size 0.5 mm×0.5 mm, arranged at a distance of several mm from the PD field pf (FIG. 6a).

A beam-tracking system can furthermore ensure compensation for image placement errors which are due to deviations in the stage movement, using a real-time feedback controller in conjunction with a multipole pattern correction. For instance, correction of image position and distortion can be done by means of a multipole electrode 325 (FIG. 1); additionally, a magnetic coil 62 can be used to generate a rotation of the pattern in the substrate plane. In FIG. 1 the position of a reference apparatus 60 according to the state of the art is shown, while the layout of a pattern-lock system according to the invention is discussed in the following with FIGS. 5ff; where not denoted otherwise in the following, the layout of the particle beam apparatus of FIG. 1 is not changed.

FIG. 5 shows an overview of a particle-beam apparatus according to the invention with emphasis on the pertinent pattern-lock system with the paths of the reference beamlets rb. As already mentioned, the reference beamlets rb are defined by means of reference structures formed in the PD device 20 from the illuminating beam lb; after the PD device, the beamlets rb are imaged together with the patterned beam proper pb by the same optical elements; in particular, they are imaged through the first crossover c1 into an image of the reference structures at the intermediate plane e1. At that place, a registering device 601 surrounds the patterned beam pb and intercepts the reference beamlets rb. (In contrast, the patterned beam is further imaged through the second and final stage of the projection system onto the target.) A detail of the arrangement at the intermediate plane is shown in the detail of FIG. 5a. The registering device 601 comprises a number of detection units 61 (one for each beamlet rb) which serve as registering means for the respective reference beamlet, and are positioned at the place where the intermediate image is formed.

This layout dispenses with the conventional requirement that the registering of the reference beams is done just in front of the target, where space problems are significant due to the strongly reduced size of the features and sensitivity of the image to influences on the imaging system. On the other hand, just because of the reduced size of the second stage, the optical system after the intermediary image i1 is easily shielded from external influences since it has a short length and the beam is comparatively little sensitive to external influences due to small diameter and high particle energy (e.g., 100 keV). On the other hand, before the intermediary image i1, the beam is difficult to shield from the surroundings and is 'soft' due to its comparatively large dimension and the low particle energy.

PD System

Figure 7:
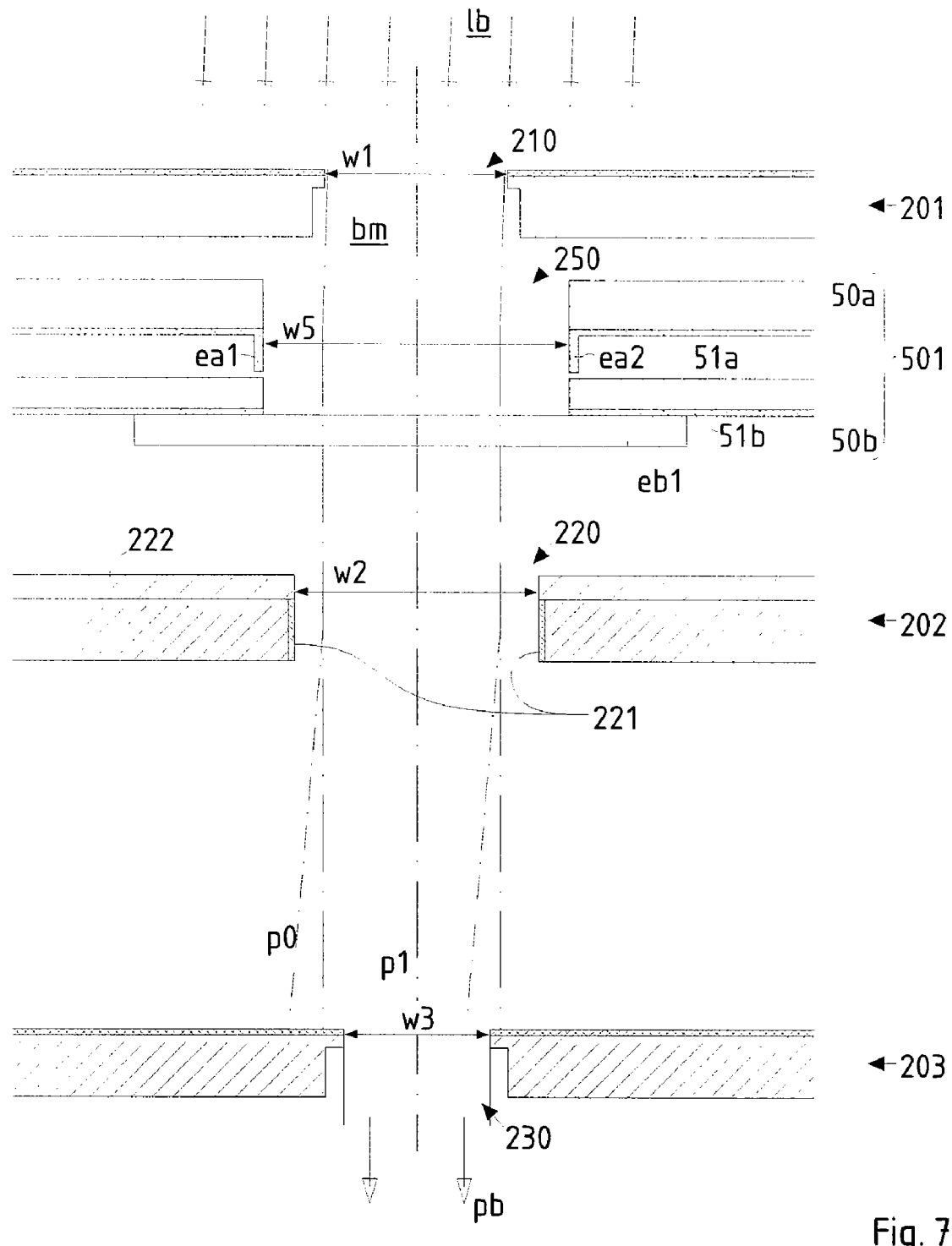
FIG. 7 shows a detail of FIG. 6b showing the details of an aperture.

FIG. 6 shows a PD system 102 adapted for use with the invention, namely, in FIG. 6a a top view and in FIG. 6b a cross-sectional view. The PD system not only serves to define the pattern in the lithography beam, but also to form the reference beamlets rb. FIG. 7 shows the configuration of one single aperture of the PD system 102 in detail, and FIG. 8 shows the configuration of a reference mark in the PD system in a like detail.

The system 102 comprises a number of plates 22 mounted in a stacked configuration. The PD system 102 according to the invention is realized as a composite device whose components serve respective functions. Each of the plates 22 is realized as a semiconductor (in particular silicon) wafer in which the structures were formed by microstructuring techniques known in the art. The lithography beam traverses the plates through an array of apertures in the PD field pf (FIG. 6). Each aperture corresponds to a set of openings 210, 220, 230, 250 which are defined in the plates 22 (FIG. 7). In the following, the PD system 102 and its component plates 22 are discussed as far as necessary to disclose the invention; for more details the reader is referred to the U.S. Pat. No. 6,768,125.

The thickness of each of the plates 22 is about 500 μm to 50 μm in the area of the apertures; their mutual distance is in the order of 10 μm to 1 mm. It should be noted that in FIGS. 6b and 7, the dimensions in the longitudinal axis (z-axis parallel to the optical axis of the apparatus) are enlarged and not to size. The plates 22 are cooled by thermal radiation from cooling elements 28, 29 (FIG. 1) provided behind and in front of the PD system 102, e.g. by means of cooled shield elements and/or using cooled electrodes of the first projector stage or the condenser lens.

The blanking of the beamlets is controlled by means of a blanking means realized as a blanking plate 202 which comprises an array of openings 220 ("blanking openings") of width w2, each corresponding to an aperture; the blanking openings, thus, form a blanking field bf in a manner analogous to the arrangement of apertures in the PD field pf. Each opening 220 comprises a set of beam blanking electrodes 221 as well as the circuitry 222 for controlling the electrodes 221. The width w2 of the openings 220 is larger than the dimension of the beamlet bm does not impinge on the electrodes 221.

The PD device 102 further comprises an aperture array means which serves to define the beamlet laterally and which is here realized as an aperture array plate 203 (in the following in short 'aperture plate') with an array of openings having a width w3. In the embodiment shown the aperture plate is situated after the blanking plate 202 as the last of the plates 22 (as seen along the direction of the beam). It should be noted that it is the aperture 230 of width w3 which defines the lateral shape of the beamlet emerging from the system 102 (corresponding to the width w of an aperture in FIG. 2).

The beamlet bm transgresses the subsequent openings of the plates 22 along the path p1 and is then imaged in the imaging system (FIG. 1), provided the blanking electrodes 221 are not energized; this corresponds to the "switched-on" state of the aperture (with respect to the switching state, no distinction is made between the blanking opening, the aperture associated with it respectively or the beamlet defined by that aperture). A "switched-off" aperture is realized by energizing the electrodes, applying a transverse voltage. In this state, the blanking electrodes 221 deflect the beamlet bm off the path p1 to a deviating path p0 so the beamlet will be absorbed, for instance at the stop plate 204 (FIG. 1) positioned at some place after the PD device. (It should be noted that it is sufficient in the switched-off state to deflect the beamlet bm by a small angle only, where the beamlet may still pass through the aperture 230; provided the deflection is sufficient to bring about a lateral deviation of the beam at a later position that is easy to block off the switched-off beamlet.)

In front of the other plates (as seen in the direction of the lithography beam) a cover means realized as a cover plate 201 is provided in order to protect the other plates, in particular the blanking plate 202 and its delicate circuitry, from irradiation damage. The cover plate 201 takes up the majority of the impingent lithography beam lb; the particles can only pass through the openings 210, formed in an array corresponding to that of the blanking plate, which openings make up only a small fraction of the total area of the blanking field bf.

As can be seen from FIG. 6b, the cover plate 201 and the aperture plate 203 are, respectively, the first and the last of the plates 22 of the PD device. This is a remarkable feature as it is only these two plates that come into contact with the radiation of the lithography beam. Therefore, only these two plates will have to be replaced at periodic intervals whereas for the other plates a provision of replacement is not necessary. (In a variant, the aperture plate 203 may be positioned as the first plate; it then fulfils the task of the cover plate. In this case only one plate comes in contact with the radiation of the lithography beam.)

The plates 22 are held by chucks 23 which are positioned with respect to each other by means of actuators 24, 25 realized as piezoactuators or nanopositioning elements of known type. The vertical actuators 25 may also be left off in order to save space; then the positioning between the plates may be defined by the height of the chucks 23 themselves which then are simply stacked on each other. It is possible to omit the horizontal actuators provided the relative position of the plates are defined in such a way to ensure that the plates do not move more than a few 100 nm. One of the chucks, in FIG. 6 for instance the chuck of the aperture plate, may be formed as a cup 233 so as to facilitate lateral positioning of the other chucks. Preferably, the plates 22 and chucks 23 are produced from the same material, e.g. silicon, or materials having the same thermal expansion behavior in the operating temperature range. The chucks also provide for the electric supply of the blanking plate 202 and correction means 205 (if present); for the sake of clarity, the electric lines are not shown in the figures.

In the plates 22 openings 26 are provided for the definition of reference beams rb as explained further below. The reference beams rb and the patterned beam pb are then imaged towards the substrate plane; in contrast to the patterned beam pb, however, the reference beams rb do not reach the substrate 41 but are measured in a pattern-lock system which is explained further below. The chucks 23 further have alignment openings 236 which serve as alignment markers for relative positioning of the chucks 23 and the plates 22 they hold.

Furthermore, one or more additional adjustment units may be provided in the PD device. In the embodiment shown here, one adjustment unit 501 is positioned between the cover and blanking plates 201, 202; in other embodiments of the invention, any suitable combination of adjustment units could be implemented. The adjustment unit serves to (statically) control the path of the beamlets bm as they travel along the set of openings 210, 220, 230, 250 of the PD system 102, thus taking into account the effects of, and correcting for, possibly non-perfect matching of the components of the apparatus 100 with the PD device and/or the alignment of components (plates) of the PD device to each other, as well as dimensional deviations of the PD device components, in particular those that will occur due to fabrication and mounting tolerances. Also, some optical aberrations like the image distortion and field curvature can be reduced as well as the image distortion caused by the global space charge effect.

Preferably, an adjustment unit 501 is positioned immediately after the first plate of the PD system, i.e., the cover plate 201, as shown in FIGS. 6 and 7. The adjustment unit 501 helps to reduce the requirements imposed on the illumination system 101 and makes the alignment of the PD plates easier. The adjustment unit 501 can be realized as explained in the following with reference to FIG. 7. An adjustment unit is composed of two deflector plates 50a, 50b, which each have conductor planes 51a, 51b comprising electrodes ea1,ea2,eb1 and the pertinent feeding lines (not shown) at the "bottom" side (the side facing towards the target). Static electric voltages can be applied to the electrodes of the adjustment unit which will correct the path geometry in a suitable way. The deflector plates 50a, 50b are aligned and fixed to each other by bonding or vacuum-compatible gluing. The electric contacts between the different conductor planes 51a, 51b are made by, for instance, wire bonding. The deflector plates are provided with an array of openings matching the apertures of the PD system, but having a width w5 which is well greater than the width w1 of the beamlet as defined by the cover plate.

Reference Mark and Beamlet Deflection

FIG. 8 shows the configuration of a reference mark in the PD system of FIG. 6 in detail. In the first plate of the PD system, i.e. the cover plate 201, a number of parallel slots, in this example five slots, are formed. This set of slots functions as reference mark 26 which defines a reference beamlet rb consisting of a corresponding number of sub-beamlets. The reference beamlet then passes through openings 260 formed in the other plates 501,202,203. The openings 260 are sufficiently wide so as to ensure unimpeded passage of the reference beamlet. The reference beamlet thus formed is then imaged as explained above with reference to FIG. 6, forming an image of the reference mark 26 on the respective detection unit 61.

A deflection unit 56 is provided in the PD system for each reference beamlet rb as means 56 to deflect the beamlet rb. Its purpose is to provide a—small but sufficient—angular deflection $\theta_r$ of the direction of the beamlet rb. The angular deflection Or serves to adjust the path of the reference beamlet so that it passes through the exposure device without being blocked by an aperture or other beam limiting device (e.g., stop plate 204) and correctly arrives at the respective detection unit. Such an angular deflection may be necessary due to higher-order aberration effects of the illumination system.

In the example shown in FIG. 8, the deflection unit 56 is mounted on the adjustment unit 501. It is worthwhile to note that the adjustment unit may also have adjustment electrodes of the kind explained with FIG. 7 for each of the reference beamlets; then, the angular deflection $\theta_r$ produced by the electrodes 561 superimposes on the (static) deflection exerted by the adjustment electrodes.

The longitudinal section of FIG. 9a and the cross-section of FIG. 9b illustrate a suitable realization of the deflection unit 56. At least one set of electrode multipoles 57 is mounted within a housing tube 562 surrounding the electrodes and containing the electric field produced by them. In the regime of small angles employed here, the angular deflection is a linear function of the strength of the electric field held in the space between the electrodes 57.

Preferably, the set of deflecting electrodes may be divided into two segments 571,572 in axial direction, as illustrated in FIG. 9a. This is, for instance, suitable for applications where it is required to move the reference beamlet rb across the detection unit in a manner independent from the other reference beamlets and/or the dye beam. In particular, if the two multipole segments apply exactly opposite electric fields to the passing beamlet rb, the beam will be shifted by an amount proportional to the field strength along the direction of the electric field, resulting in a shift of the position of the image of the reference mark 26 on the detection unit, but no angular deflection is imparted to the beamlet. An additional angular deflection is applied if the two electric fields add to a net value different from zero. The two segments 571,572 are controlled individually, which allows to adjust the angular deflection $\theta_r$ and beamlet shift independently from each other.

By means of the angular deflection $\theta_r$ the reference beamlet can be deflected, in particular in radial direction with respect to the optical axis. This ensures that the reference beamlets, despite being located at a considerable distance to the optical axis cx and thus being subject to possibly substantial off-axis aberrations of the optics, can be guided through the optical column and in particular the crossover c1 without a collision with any beam limiting devices (e.g., stop plate). Furthermore, by virtue of introducing a beamlet shift, the deflection units can further be used for fine correction of the hit position of the reference beamlets at the detection units. Consequentially, the hit position of the reference beamlets is adjusted by means of the deflection units in a way giving maximal signal response for positional deviations of the reference beamlets.

Detection Unit

As already mentioned, each of the reference marks 26 is imaged onto a respective detection unit 61 comprised in the registering device 601. FIGS. 10 to 14 show suitable realizations of a detection unit 61. In these examples, it is assumed that the reference beamlet consists of three sub-beamlets; this case can easily be extended to other reference beamlet configurations.

Figure 10:
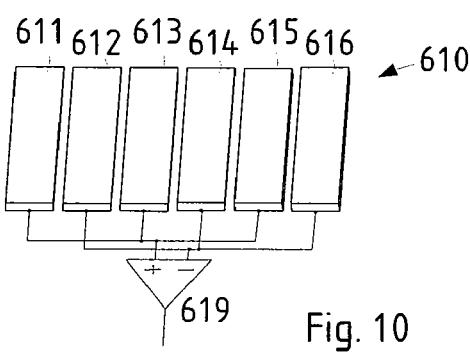
FIG. 10 shows a first variant of a detection unit.

Referring to the detection unit 610 of FIG. 10, six register pads 611,612,613,614,615,616 are provided which are alternatively connected with the positive and negative input of a differential amplifier 619. The pads 611-616 are formed as adjacent stripes of uniform, preferably oblong, shape and made of a electrically conductive material isolated from each other and against the surrounding. The material is absorptive to the electrically charged radiation. Consequentially, when a field is hit by the radiation of a reference beam, it will be electrically charged and the resulting electrical current is measured through the connected differential amplifier 619. Alternatively, the pads may be made of a material with a high coefficient for the production of secondary electrons, in which case the impingent radiation would cause a charging effect mainly due to the production of secondary electrons. In both cases, the electrical current is proportional to the amount of radiation on a pad. The register pads are arranged within a field corresponding to the dimensions of the reference mark 26; in the embodiment discussed here, they are formed as stripes within a field of about 36 μm side length. If six pads are realized within this field, each pad will be about 6 μm wide; if the number of pads is higher, the width will be reduced accordingly.

Figure 11:
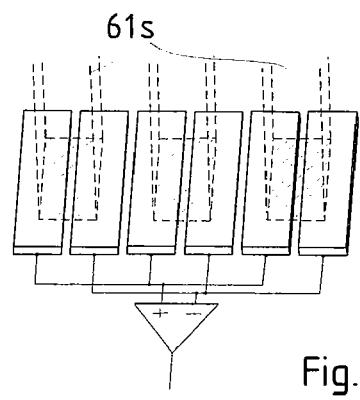
FIG. 11 shows the detection unit of FIG. 10 being irradiated by a reference beam.

FIG. 11 illustrates the register pads 611-616 being irradiated by the sub-beamlets 61s of the reference beam. In the case shown, the same amount of irradiation is imparted to the positive pads 611,613,615 and the negative pads 612,614, 616; if the reference beam moved toward the right, then the positive pads would produce correspondingly more electric current while the current of the negative pads would likewise diminish, resulting in a distinct difference signal at the output of the differential amplifier 619.

Figure 12:
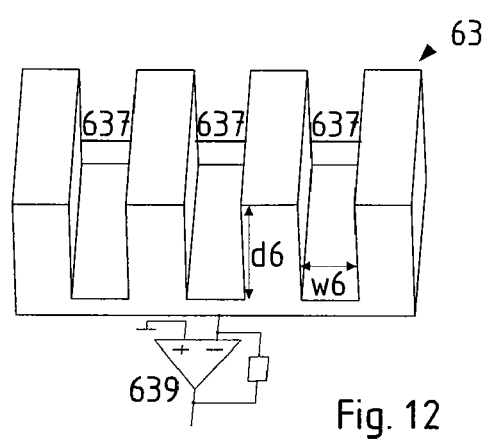
FIG. 12 shows a second variant of a detection unit.

FIG. 12 shows a variant detection unit for a reference beam consisting of three sub-beamlets, realizing a groove detector 63. The detector 63 is realized as a piece of electrically conducting material which is isolated against the surrounding and connected to the input of an amplifier 639 which serves to measure the current against ground (surroundings). Several grooves 637, in this case shaped as three stripes so as to form a comb-like structure, are provided with the depth d6 of the grooves being greater than their width w6. Of course, the structure of the grooves corresponds with the structure of the reference beam (sub-beamlets).

Figure 13:
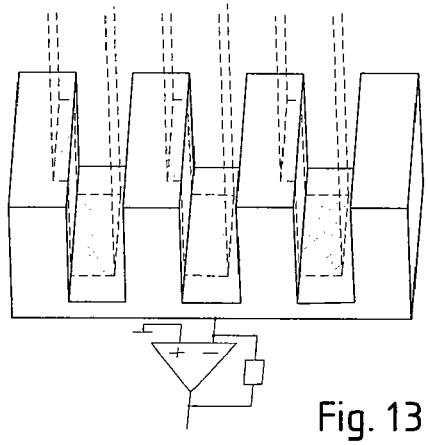
FIG. 13 shows the detection unit of FIG. 12 being irradiated by a reference beam.

Referring to FIG. 13, irradiation by a reference beam of electron radiation causes emission of secondary electrons from the surface of the detector material. The secondary electron will radiate off into all directions. Within the groove, the secondary electrons are absorbed by the walls, like in a Faraday cup, and a resulting negative current will be measured corresponding to the impingent electron beam; those beam portions which hit the ridge regions, however, will cause secondary electrons that can leave the detector freely, so a net effect of electron lack will result, i.e., a positive current. Thus, the sign and value of the resulting current varies according to its position with respect to the groove-ridge boundary: negative if the sub-beamlets predominantly fall into the grooves and positive if the major portion hits the ridges.

The same effect will be observed for a beam of negative charged ions. For positive charged ions, the resulting current will be positive always, but with the amplitude depending on the position.

Figure 14:
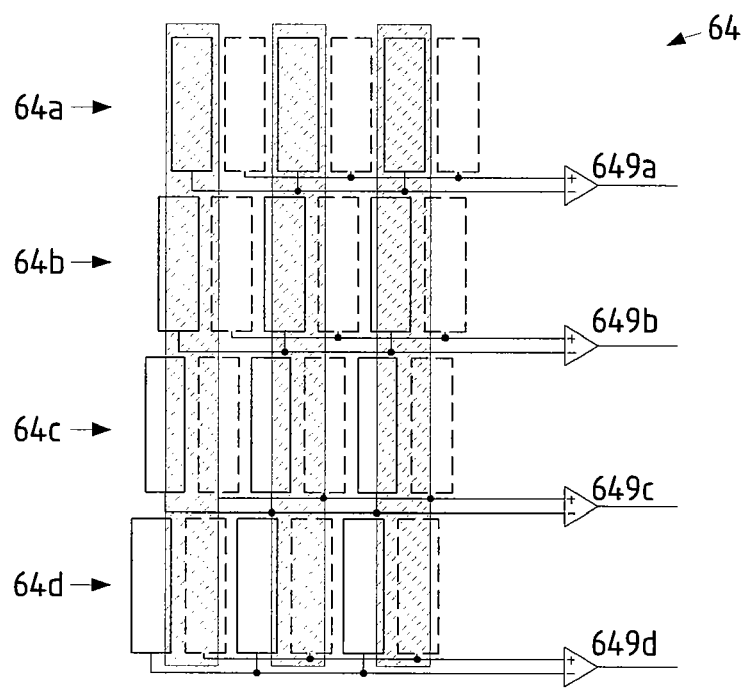
FIGS. 14 and 15 show two further variants of detection units.

FIG. 14 illustrates a "multi-detection unit" 64 with a two-dimensional arrangement of register pads. Four sets of pads 64a,64b,64c,64d of the kind shown in FIG. 10 are positioned in parallel, but slightly offset. Thus, the reference beam will cause a different detector signal with each of the pad sets at the output of the individual amplifiers 649a-649d.

Figure 15:
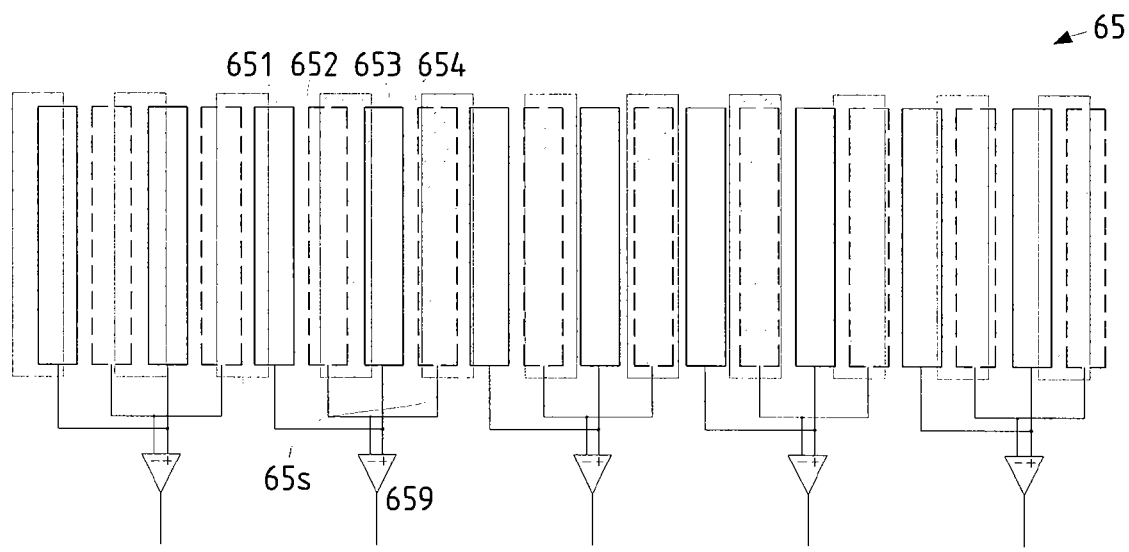

FIG. 15 shows a linear variant 65 of a "multi-detection unit". In this example, five pad sets are arranged in one line, each set consisting of two pairs of pads 651,652,653,654 connected to differential amplifiers 659. The offset of the pads of same sign is not quite the same as the offset of the sub-beamlets 65s, so the individual pad sets will be hit in different manners by the reference sub-beamlets resulting in different net output signals of the amplifiers 659.

It is worthwhile to note that the configuration of the register pads need not be exactly corresponding to the configuration of the sub-beamlets of the reference beam; in fact it will be useful if the shape of the register pads suitably differs from the reference sub-beamlets as already exemplified in FIG. 15.

Figure 16:
FIG. 16 shows another configuration of a detection unit.
Figure 17:
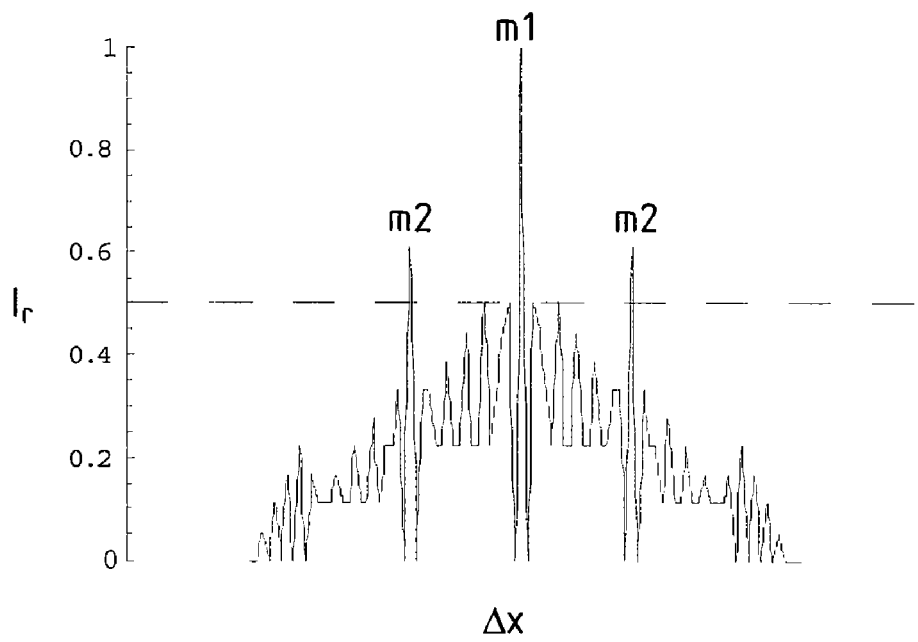
FIG. 17 shows the resulting current pattern as a function of the position of the reference beam with respect to the detection unit of FIG. 16.

Furthermore, referring to FIGS. 16 and 17 it may be advantageous if the structure of the pads and sub-beamlets is not uniformly periodic. FIG. 16 shows the profile 67 of a non-periodic structure of a groove detector (cf. the discussion of FIG. 12 above) wherein the width of the grooves varies: the width of selected grooves 677 is, for instance, doubled. In this example, the configuration of the sub-beamlets of the reference beam is likewise modified so as to correspond with the detector groove structure. Grace to the structure with suitably modified groove widths the intensity of the resulting detector current $I_r$ will display a complex dependence upon the relative position $\Delta x$ of the reference beamlet, as shown in FIG. 17. One distinct feature is the occurrence of the high-contrast central main maximum m1; another advantageous feature is the presence of secondary maxima m2 which come about through a proper choice of distance of structure features, in a symmetric arrangement, and allow to measure the width of the reference scanning movement.

Pattern-Lock Control Loop

Referring again to FIG. 5, the signals produced by the detection units, such as the detector currents $I_r$, are collected as input signals s1 and led to a pattern-lock control unit PCU for evaluation in order to obtain positional information for each reference beamlet. From the positional information the relative distortion state of the dye beam in terms of X/Y displacement, rotational displacement, magnification distortion, trapezoidal distortion, etc. can be determined.

From these data, in turn, the control unit PCU calculates the amount of deviation from desired nominal values and determines corresponding correction signals s2. The signals s2 are fed back to the optical column by means of adjustment elements 315 of the optical column (e.g., electrostatic multipoles and/or magnetic elements as mentioned above) using a PID closed loop controller, in order to minimize the displacement/distortion signal and thus reducing the corresponding displacement/distortion state of the dye beam relative to some reference plane. The measurement of the detector signal is done with a measuring rate of, for instance, 1 kHz. This allows to determine and compensate mis-positioning influences which affect the reference beams (and consequently, the dye beam) within a frequency range below the measuring rate, i.e., in this case up to several 100 Hz. It should be noted that the patternlock will only keep a stable displacement/distortion state relative to some reference plane, while the displacement/distortion state control with respect to a the target (e.g., wafer) must be maintained by additional procedures/devices probably very similar to patternlock itself, usually termed as alignment.

In order to perform the position detection for the reference beamlets, suitable voltage variations are applied to the electrodes of each deflection unit 56 such that the corresponding reference beamlets, and consequently the reference mark images, are scanned over the detection units thus giving a characteristic signal which in turn can be evaluated to give the desired beamlet position.

Simplified Beamlet Deflection

A simplified layout of a deflection unit is shown in FIGS. 18 and 19. In this case, a reference beamlet passes through a deflection unit 56' which comprises a pair of deflection plates 561 only. The deflection plates are oriented in a manner that their main axis mx (the horizontal axis in FIG. 19b) intersects with the optical axis cx of the exposure apparatus thus allowing angular deflection of the beamlets for the purpose of guiding them through the column without a collision with any beam limiting devices. This angular deflection in combination with the present off axis aberrations further provide a possibility for fine adjustment of the position of the image of the reference beamlets formed in the reference plane.

This simplified layout in combination with a recalibration scheme as discussed below with regard to FIG. 20 has the advantage that the deflection units 56' are much simpler than those discussed above, and further that scanning of beamlets is not required any more. Moreover, if it is possible to illuminate the PD device 20 in a way that allows the reference beamlet to pass all apertures in the beamline without correction in the PD device, the deflection unit may be omitted. In this case the fine adjustment of the hit position of the reference beamlets at the detection units can be done by other means, e.g. suitable adjustment of the optical elements of the first projection stage and/or selection of a suitable portion of the detection unit in the registering device, such as one of the pad sets of the "multi-detection units" 64,65 shown in FIGS. 14 and 15.

In this case, in order to perform the position detection for the reference beamlets, a scanning of beamlets should be avoided so the reference beamlets will nominally have a fixed position, thus giving a fixed signal level at the detector unit. Variations of the reference beamlets positions due to disturbances will result in variation of signal level on the corresponding detector, this signal level variations in turn are used for position determination of the reference beamlets.

Recalibration Scheme

Figure 20:
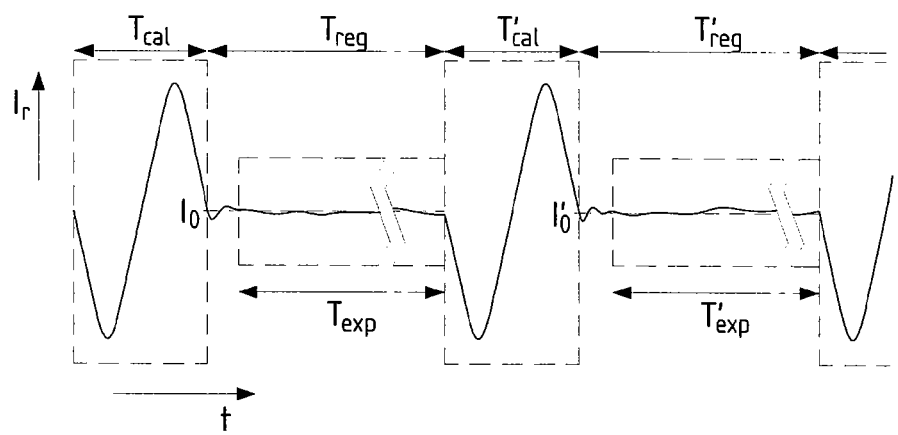
FIG. 20 illustrates recalibration of the pattern-lock control system.

FIG. 20 which shows an example of a detection unit signal $I_r$ as a function over time t, illustrates a preferred method combining, in a cycle, recalibration of the reference beamlet position and control of pattern-lock. This method exploits the fact that in a manufacturing process of a processing apparatus 100, exposure of a target takes place during defined intervals of time $T_{exp}$ which are separated by periods where the target is not exposed; during these exposure pauses, the dye beam is usually switched off or otherwise blanked out.

According to the method proposed, during an exposure pause recalibration of the reference beamlets is preformed. For this, the reference beamlets (together with the dye beam) are actively scanned over the detector range by means of the deflection units 315. This active scanning is performed in a time interval $T_{cal}$ at the beginning of an exposure pause. FIG. 20 illustrates that during recalibration two extremal peaks are detected which mark the two ends of the operable regime, and towards the end of the calibration interval $T_{cal}$ an operating point $I_0$ is adopted in the center between these two extremals (in FIG. 20 only a simplified single ramp between both extremals is shown rather than the whole complex characteristic of a detection unit for clarity).

After an operating point has been chosen and the calibration interval $T_{cal}$ finished, patternlock control is resumed using the signal $I_r$ for pattern-lock feedback as described. The patternlock control interval $T_{reg}$ fully embeds the time of one or more consecutive dye exposure steps $T_{exp}$. During a dye exposure step, the reference beamlets hit the detectors without active scanning. By this measure, the reference beamlets are rigid with respect to the dye beam, and their position is used as indication of the position of the dye beam. This method allows to determine the complete signal behavior over the detector range and recalibrate the detector and amplifier, in particular with regard to the base position of the detector range. By this method, the base position can be adjusted to the center of the signal range which can then be used during the next exposure step(s). Suitably, an operating point $I_0$ is chosen at which the slope of the signal is sufficiently high (for a high resolution) and allows sufficient space for control to either side.

In order to get reliable signal levels from the detection units periodic recalibration of the individual detector response functions are necessary. By means of the recalibration any drifts in the detection units can be compensated. In a PML2 system this recalibration can advantageous be done in every writing pause necessary for the stage movement reversal action after every written image stripe.

Although the invention is illustrated and described herein with reference to specific embodiments, the invention is not intended to be limited to the details shown. Rather, various modifications may be made in the details within the scope and range of equivalents of the claims and without departing from the invention.

We claim:

1. A method of controlling the positioning of an image of a pattern in a particle-beam projection processing apparatus during exposure of a target with said image wherein said pattern is formed in a pattern defining means and is, by means of a beam of electrically charged particles, imaged through a particle-optical projecting system onto said target, said method comprising the following steps:

imaging a number of reference marks provided in said pattern defining means through the same projecting system onto a corresponding number of registering means positioned at locations of desired positions of images of the reference marks, detecting images of said reference marks at said registering means generating corresponding signals, processing said signals in a control means and deriving control signals for adjusting the imaging properties of said projecting system and bringing said reference mark images into coincidence with said desired positions, the imaging of said pattern being done by means of at least two consecutive projector stages of said projecting system, namely, at least one non-final projector stage and one final projector stage, the latter producing said image of the pattern, wherein the detection of reference marks images is done at the location of an intermediary image of a non-final projector stage, the registering means being positioned at locations of nominal positions of an intermediary imaging plane.

2. The method of claim 1, wherein reference beamlets formed by at least one of the reference marks are shifted laterally by deflector means provided in the pattern defining means in dependence of a time-dependent electric voltage applied to said deflector means, resulting in a corresponding time-dependent scanning movement of the respective reference mark image(s).

3. The method of claim 2, wherein the lateral shift of the reference beamlets is generated by at least two sets of electrodes, said sets being positioned in series as seen along the direction of the beamlets.

4. The method of claim 3, wherein electrode multipoles are used as said sets of electrodes.

5. A particle-beam projection processing apparatus adapted to expose a target with an image of a pattern, comprising a pattern defining means to form said pattern and a particle-optical projecting system adapted to image said pattern onto said target by means of a beam of electrically charged particles, the apparatus further comprising a positioning controlling system which comprises a control means and a number of registering means to detect images of a corresponding number of reference marks provided in said pattern defining means when imaged through the same projecting system, said registering means being positioned at locations of desired positions of images of the reference marks, and being adapted to generate signals corresponding to said images, said control means being adapted to processing said signals and deriving control signals for adjusting the imaging properties of said projecting system and bringing said reference mark images into coincidence with said desired positions, said projecting system comprising at least two consecutive projector stages for imaging said pattern, namely, at least one non-final projector stage and one final projector stage, the latter producing said image of the pattern, wherein the registering means are positioned at locations of nominal positions of an intermediary imaging plane, the positioning controlling system being adapted to perform the detection of reference marks images at the location of an intermediary image of a non-final projector stage.

6. The apparatus of claim 5, comprising deflector means provided in the pattern defining means, said deflector means being adapted to laterally shift reference beamlets formed by at least one of the reference marks in dependence of a time-dependent electric voltage applied to said deflector means, resulting in a corresponding time-dependent scanning movement of the respective reference mark image(s).

7. The apparatus of claim 6, wherein at least two sets of electrodes are provided for generating the lateral shift of the reference beamlets, said sets being positioned in series as seen along the direction of the beamlets.

8. The apparatus of claim 7, wherein said sets of electrodes are realized as electrode multipoles.

* * * * *